(12) United States Patent
Wimplinger et al.

(10) Patent No.: US 11,355,374 B2
(45) Date of Patent: *Jun. 7, 2022

(54) ACCOMMODATING DEVICE FOR RETAINING WAFERS

(71) Applicant: EV Group E. Thallner GmbH, St. Florian am Inn (AT)

(72) Inventors: Markus Wimplinger, Ried im Innkreis (AT); Thomas Wagenleitner, Aurolzmunster (AT); Alexander Filbert, St. Florian am Inn (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

This patent is subject to a terminal disclaimer.

(21) Appl. No.: 17/106,402

(22) Filed: Nov. 30, 2020

(65) Prior Publication Data

US 2021/0104425 A1 Apr. 8, 2021

Related U.S. Application Data

(60) Continuation of application No. 16/283,889, filed on Feb. 25, 2019, now Pat. No. 10,886,156, which is a continuation of application No. 14/693,074, filed on Apr. 22, 2015, now Pat. No. 10,325,798, which is a division of application No. 13/994,183, filed as application No. PCT/EP2010/007793 on Dec. 20, 2010, now Pat. No. 9,312,161.

(51) Int. Cl.
*H01L 21/68* (2006.01)
*H01L 21/683* (2006.01)
*H01L 21/67* (2006.01)
*H01L 21/66* (2006.01)

(52) U.S. Cl.
CPC ........ *H01L 21/68* (2013.01); *H01L 21/67288* (2013.01); *H01L 21/683* (2013.01); *H01L 21/67092* (2013.01); *H01L 22/12* (2013.01)

(58) Field of Classification Search
CPC . H01L 21/68; H01L 21/67288; H01L 21/683; H01L 21/67092; H01L 22/12
See application file for complete search history.

(56) References Cited

U.S. PATENT DOCUMENTS

| 4,475,223 A | 10/1984 | Taniguchi et al. |
| 4,503,335 A | 3/1985 | Takahashi |
| 5,094,536 A | 3/1992 | MacDonald et al. |

(Continued)

FOREIGN PATENT DOCUMENTS

| CN | 1453636 A | 11/2003 |
| CN | 1629759 A | 6/2005 |

(Continued)

OTHER PUBLICATIONS

U.S. Appl. No. 13/994,183, filed Aug. 9, 2013.
(Continued)

*Primary Examiner* — Timor Karimy
(74) *Attorney, Agent, or Firm* — Kusner & Jaffe

(57) ABSTRACT

A receiving means for receiving and mounting of wafers, comprised of a mounting surface, mounting means for mounting a wafer onto the mounting surface and compensation means for active, locally controllable, compensation of local and/or global distortions of the wafer.

2 Claims, 9 Drawing Sheets

(56) References Cited

U.S. PATENT DOCUMENTS

| | | | |
|---|---|---|---|
| 5,329,126 A | 7/1994 | Amemiya et al. | |
| 5,506,793 A | 4/1996 | Straayer et al. | |
| 5,667,622 A | 9/1997 | Hasegawa et al. | |
| 7,127,810 B2 | 10/2006 | Kasuga et al. | |
| 7,136,146 B2 | 11/2006 | Hayashi | |
| 7,452,793 B2 | 11/2008 | Kaushal et al. | |
| 7,526,858 B2 | 5/2009 | Kasuga et al. | |
| 8,454,771 B2 | 6/2013 | Horikoshi | |
| 8,496,466 B1 | 7/2013 | Treves et al. | |
| 9,299,620 B2 | 3/2016 | Horikoshi | |
| 9,312,161 B2* | 4/2016 | Wimplinger | H01L 21/67288 |
| 10,325,798 B2* | 6/2019 | Wimplinger | H01L 21/683 |
| 10,886,156 B2* | 1/2021 | Wimplinger | H01L 21/67288 |
| 2003/0081193 A1 | 5/2003 | White et al. | |
| 2004/0036850 A1 | 2/2004 | Tsukamoto et al. | |
| 2006/0237421 A1 | 10/2006 | Lee et al. | |
| 2006/0241891 A1 | 10/2006 | Kaushal et al. | |
| 2007/0160507 A1 | 7/2007 | Satoh et al. | |
| 2008/0171131 A1 | 7/2008 | Moro et al. | |
| 2008/0188036 A1 | 8/2008 | La Tulipe et al. | |
| 2009/0110805 A1 | 4/2009 | Kaeppeler et al. | |
| 2012/0006463 A1 | 1/2012 | Gaudin | |

FOREIGN PATENT DOCUMENTS

| | | |
|---|---|---|
| CN | 101342679 A | 6/2005 |
| CN | 101286430 A | 10/2008 |
| DE | 33 06 999 A1 | 10/1983 |
| DE | 195 00 382 A1 | 7/1995 |
| DE | 10 2004 058 456 A1 | 6/2006 |
| EP | 0 320 297 A2 | 6/1989 |
| EP | 0 411 916 A2 | 2/1991 |
| EP | 1 098 354 A2 | 5/2001 |
| EP | 1 278 245 A1 | 1/2003 |
| EP | 1 548 503 A2 | 6/2005 |
| JP | S53-121452 | 9/1978 |
| JP | S56-26437 A | 3/1981 |
| JP | S63-028035 A | 2/1988 |
| JP | H06-208942 A | 7/1994 |
| JP | H06-302550 A | 10/1994 |
| JP | S57-204547 A | 10/1994 |
| JP | H08-35936 A | 2/1996 |
| JP | H10-256356 A | 9/1998 |
| JP | 2003-318372 A | 11/2003 |
| JP | 2004-158610 A | 6/2004 |
| JP | 2004-335855 A | 11/2004 |
| JP | 2007-158200 A1 | 6/2007 |
| JP | 2007-266319 A | 10/2007 |
| JP | 2007-317732 A | 12/2007 |
| JP | 2008-076157 A | 4/2008 |
| JP | 2008-168413 A | 7/2008 |
| JP | 2008-172093 A | 7/2008 |
| JP | 2008-177303 A | 7/2008 |
| JP | 2008-182016 A | 8/2008 |
| JP | 2008-262971 A | 10/2008 |
| JP | WO-2009/022457 A1 | 2/2009 |
| JP | 2009-200247 A | 9/2009 |
| JP | 2010-098013 A | 4/2010 |
| JP | 2011-216833 A | 10/2011 |
| TW | 494588 B | 7/2002 |
| TW | 503440 B | 9/2002 |
| TW | 200527499 A | 8/2005 |
| WO | WO-2001/078108 A2 | 10/2001 |
| WO | WO-2009/133682 A1 | 11/2009 |

OTHER PUBLICATIONS

U.S. Appl. No. 14/693,074, filed Apr. 22, 2015.

U.S. Appl. No. 16/283,889, filed Feb. 25, 2019.

International Search Report from corresponding International Patent Application No. PCT/EP2010/07793, dated Jul. 27, 2011.

Office Action issued in corresponding Taiwanese Patent Application No. 100147527 citing JP-2004-158610-A and JP-2008-262971-A as category "Y" relevance dated Sep. 9, 2015 (English-language translation previously provided).

Office Action issued in corresponding European Patent Application No. 15 150 980.9-1551 dated Nov. 27, 2015.

Search Report issued in corresponding Taiwanese Patent Application No. 104101544 dated Apr. 20, 2016 (English-language translation previously provided).

Office Action issued in corresponding Taiwanese Patent Application No. 104101554 dated Apr. 22, 2016 (summarized English-language translation previously provided).

Office Action issued in corresponding U.S. Appl. No. 14/693,074 dated Dec. 13, 2016.

Office Action issued in corresponding U.S. Appl. No. 14/693,074 dated Jul. 5, 2017.

Office Action issued in corresponding U.S. Appl. No. 14/693,074 dated May 16, 2018.

Office Action issued in corresponding U.S. Appl. No. 14/693,074 dated Dec. 20, 2018.

Office Action issued in corresponding U.S. Appl. No. 16/283,889 dated Oct. 4, 2019.

Office Action issued in corresponding U.S. Appl. No. 16/283,889 dated Jan. 30, 2020.

Office Action issued in corresponding U.S. Appl. No. 16/283,889 dated Jun. 1, 2020.

Office Action issued in corresponding Japanese Patent Application No. 2020-018976 dated Nov. 17, 2021.

English-language translation of Office Action issued in corresponding Japanese Patent Application No. 2020-018976 dated Nov. 17, 2021.

* cited by examiner

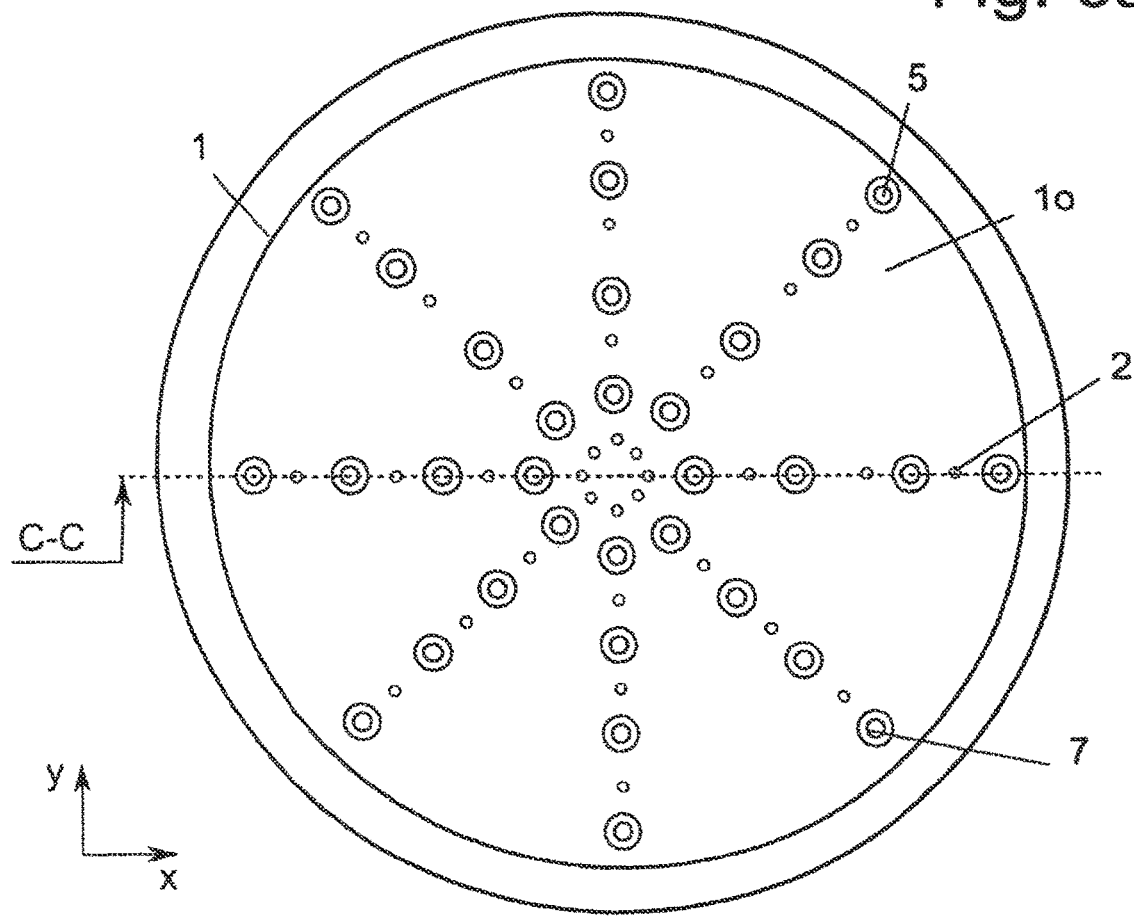
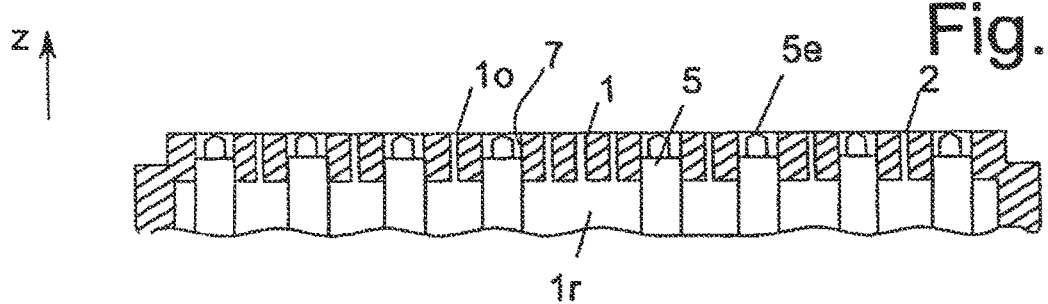

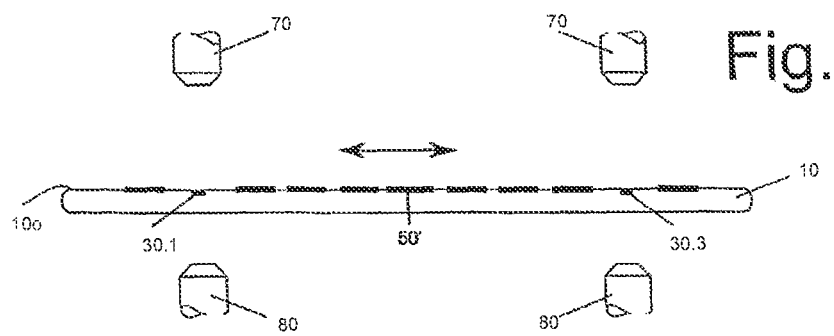
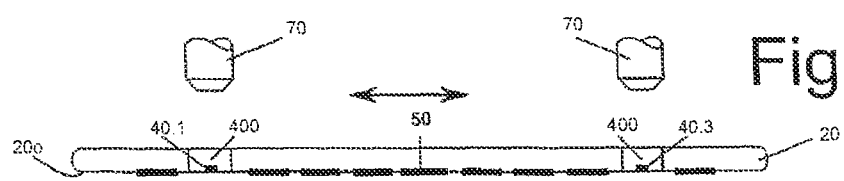
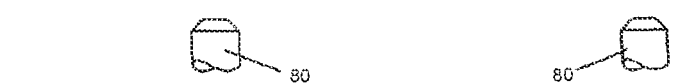
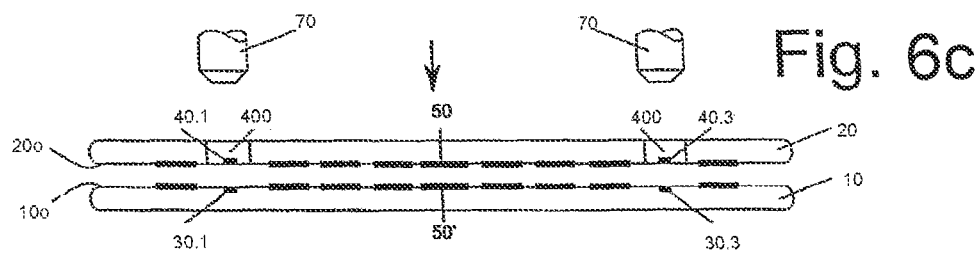

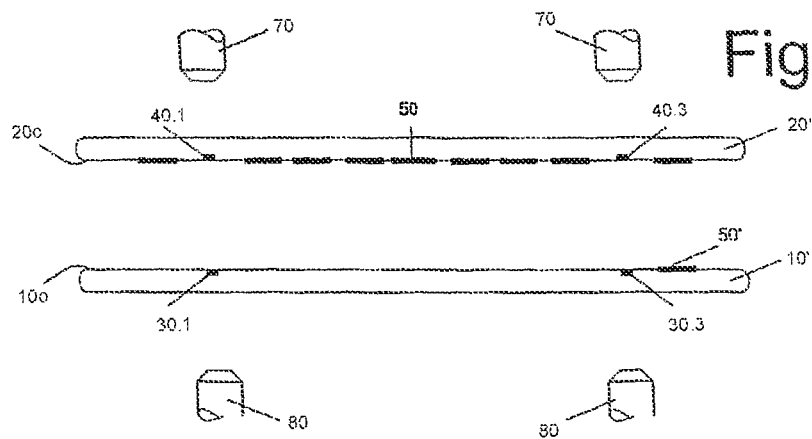
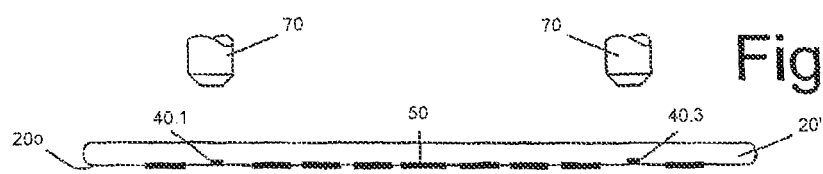
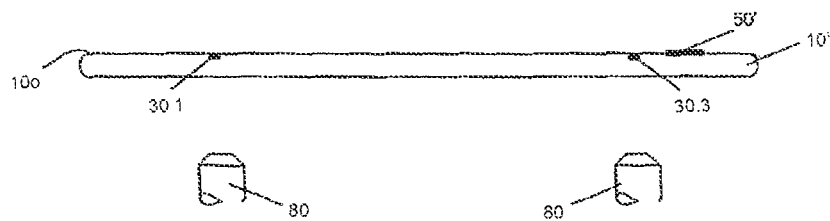

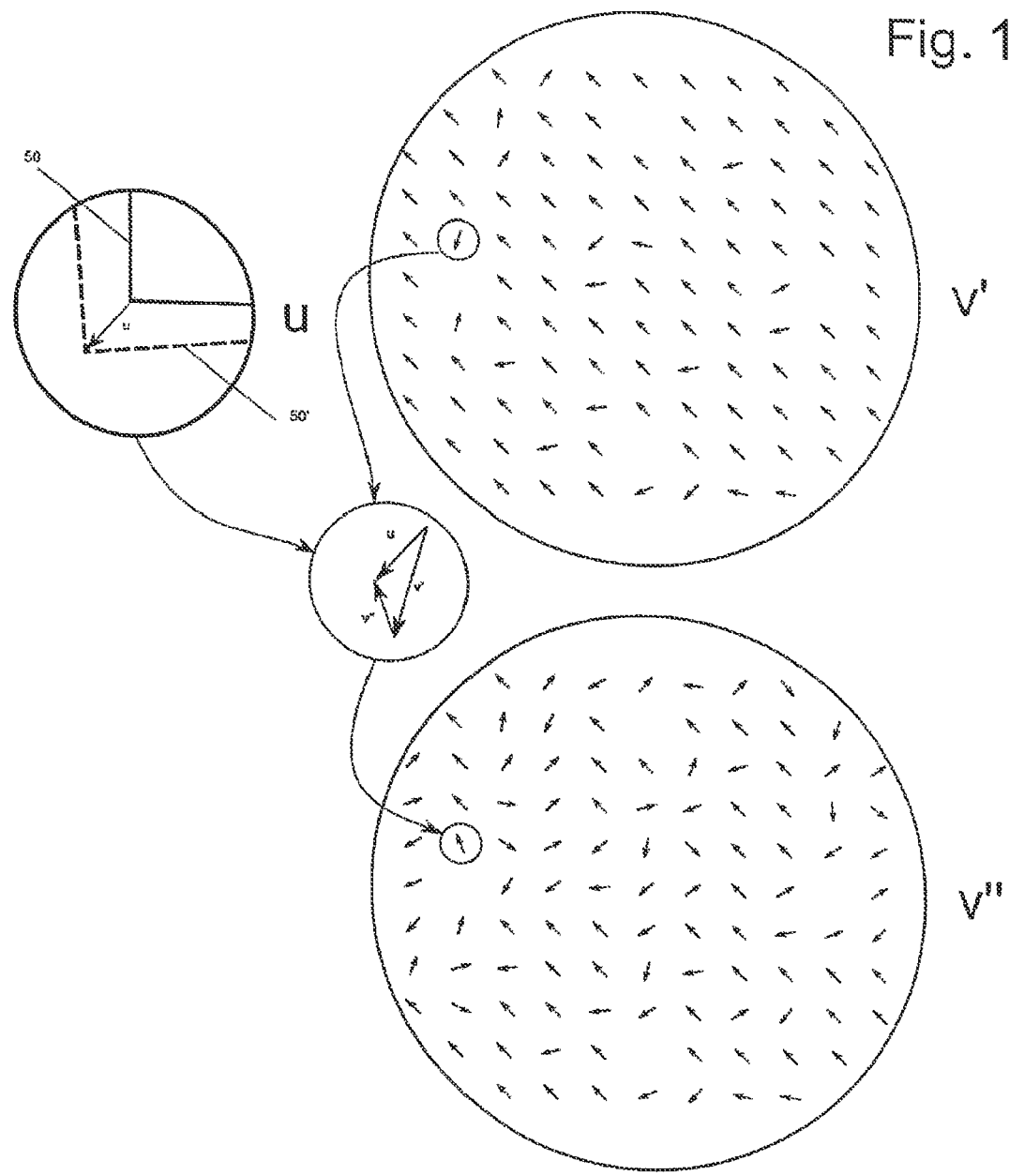

A CCOMMODATING DEVICE FOR RETAINING WAFERS

CROSS-REFERENCE TO RELATED APPLICATIONS

The present application is a continuation of U.S. application Ser. No. 14/693,074, filed Feb. 25, 2019, which is a continuation of U.S. application Ser. No. 14/693,074, filed Apr. 22, 2015 (now U.S. Pat. No. 10,325,798, issued Jun. 18, 2019), which is a division of U.S. Ser. No. 13/994,183, filed Aug. 9, 2013 (now U.S. Pat. No. 9,312,161, issued Apr. 12, 2016), which is a U.S. National Stage Application of International Application No. PCT/EP2010/007793, filed Dec. 20, 2010, said patent applications hereby fully incorporated herein by reference.

FIELD OF THE INVENTION

The invention relates to a receiving means for receiving and mounting of wafers and a device and a method for aligning a first wafer with a second wafer using the receiving means.

BACKGROUND OF THE INVENTION

Receiving means for receiving and mounting of wafers or sample holders or chucks are available in diverse versions and a flat receiving surface or mounting surface is important for the receiving means, so that structures, which are becoming smaller and smaller, can be correctly aligned and bonded on wafer surfaces, which are larger and larger over the entire wafer surface. This is especially important when a so-called prebonding step, which joins the wafers to one another by means of a separable interconnection, is carried out before the actual bond process. High alignment accuracy of the wafers to one another is especially important when an alignment accuracy or especially distortion values of <2 μm are to be achieved for all structures located on one or both wafers. In the vicinity of the alignment marks this succeeds especially well in the indicated receiving means and devices for alignment, so-called aligners, especially bond aligners. With increasing distance from the alignment marks, controlled and perfect alignment with alignment accuracies or especially distortion values better than 2 μm, especially better than 1 μm and even more preferably better than 0.25 μm cannot be achieved.

SUMMARY OF THE INVENTION

The present invention provides improved generic receiving means such that more accurate alignment can be achieved with them.

This object is achieved with the features of the claims. Advantageous developments of the invention are given in the dependent claims. All combinations of at least two of the features given in the specification, the claims and/or the figures also fall within the framework of the invention. At the given value ranges, values within the indicated limits will also be disclosed as boundary values and will be claimed in any combination.

The invention is based on the finding of the applicant according to European patent applications EP 09012023 and EP 10 015 569 (corresponding to U.S. Patent Application Publication Nos. US 2012/0237328 A1 and US 2012/0255365 A1, respectively), with the former a detection of the entire surface, especially the positions of the structures on the surface of each wafer as a position map of the wafer being possible. The latter invention relates to a device for determining local alignment errors which have occurred due to strain and/or distortion of the first wafer relative to a second wafer when the first wafer is joined to the second wafer, with the following:

a first strain map of strain values along a first contact surface of the first wafer and/or a second strain map of strain values along a second contact surface and evaluation means for evaluating the first and/or second strain maps by which the local alignment errors can be determined. US 2012/0237328 A1 and US 2012/0255365 A1 are hereby incorporated herein by reference.

At least one strain map of strain values is determined along at least one of the substrates after joining the substrates, and with the determined strain values local alignment errors can be determined. Local alignment errors relate preferably to local structures or groups of local structures of the substrates.

A displacement map of the substrate or the two substrates is prepared for the displacements caused by the joining of the substrates. The displacements are caused especially by distortions and/or strains of the substrates.

The seriousness (→distortion vectors) of the distortion introduced by the pre-bonding step or joining step is estimated, especially at a plurality of local positions on the respective substrate, preferably at positions dictated by a position map of the respective substrate. The alignment accuracy which has actually been achieved after the pre-bonding can be measured using the transparent window, but this indicates, as described below, only little about the actually achieved accuracy on the entire wafer since it is these distortions which can degrade the result. Since the wafers are not transparent to infrared radiation, the alignment accuracy cannot be directly measured. This is estimated by means of detecting the stress maps and/or the strain maps.

One important aspect is that the apparatus can be provided separately from the alignment device as an independent module.

The module division can be as follows:
1) module for detecting a stress and/or strain map before joining (bonding or pre-bonding)
2) alignment module especially according to US 2012/0237328 A1. But wafer alignment could also take place using only two alignment marks. In this case the position maps would not be detected by real measurement, but would be known based on the wafer layout.
3) at least one measurement module for detecting the stress maps after bonding.

Another application could be conceived in which one of the two wafers is largely unstructured, i.e. has at maximum alignment marks. In this case it is a matter of being able to estimate distortions of the structured wafer. In this embodiment there is no "measured" position map, but only information or data about existing distortions of the exposure fields and information on where these exposure fields are located on the wafer. These data are "read in" and would be known on the one hand from the wafer layout (positions). The already existing distortions are measured with a measurement device which is suitable for this purpose (generally the lithography system is used for this purpose).

In this situation the focus can be less on the alignment (exact alignment) (one of the wafers is largely unstructured), but only distortions of the structured wafer are relevant. The alignment between the two wafers is either only coarse here (mechanical—edge to edge) or optical (by means of the alignment marks which are applied to largely unstructured wafers).

The demands on the optical alignment are however generally rather low.

The position maps are recorded/detected in one advantageous version as in US 2012/0237328 A1 which is described again here.

It describes a method in which the X-Y positions of alignment keys of two substrates which are to be aligned can be detected or measured in at least one X-Y coordinate system which is independent of the movement of the substrates so that the alignment keys of a first substrate can be aligned by correlation of the pertinent alignment keys of a second substrate into the corresponding alignment positions. Thus a position map of each substrate which is to be aligned is prepared.

In other words: The device makes available means for detecting the movement of the substrates, especially exclusively in an X- and Y-direction, which are references to at least one fixed, especially locally fixed reference point and thus at least in one X- and Y-direction enable an exact alignment of the corresponding alignment keys.

The position map can be recorded with the following steps:
  arrangement of the first contact surface in a first X-Y plane and of the second contact surface in a second X-Y plane which is parallel to the first X-Y plane,
  detection of X-Y positions of first alignment keys which are located along the first contact surface in a first X-Y coordinate system which is independent of the movement of the first substrate by first detection means and detection of X-Y positions of second alignment keys which are located along the second contact surface and which correspond to the first alignment keys in a second X-Y coordinate system which is independent of the movement of the second substrate by second detection means,
  alignment of the first contact surface in a first alignment position which is determined based on the first X-Y positions and alignment of the second contact surface in a second alignment position which lies opposite to the first contact surface and which is determined based on the second X-Y positions.

This also applies especially to the recording and movement of wafers on the platforms and the coordinate systems and their relation to one another which can also be used for recording/detecting the strain maps and/or stress maps if nothing to the contrary is described here.

By the combination of positions maps, strain maps and/or stress maps, especially in conjunction with the transparent regions, it is possible to detect faulty alignment which occurs after or due to contact of the wafers, especially after or during the pre-bonding step and to separate the wafers from one another again or to separate them from the production process.

One problem is that with existing technologies, conventionally only a very highly limited number of alignment marks is detected. Conventionally the alignment is carried out only using 2 alignment marks. This can then result in the above described adverse effects that the alignment can be good at the locations of the alignment marks and in the regions directly adjacent to the alignment marks, while the alignment in the remaining regions of the wafer can be inadequate.

Another problem consists in that depending on the selected bond process both in pre-bonding of the wafers and also in final bonding of the wafers, mechanical distortions can occur on one or two wafers which can lead either locally or even globally to degradation of the alignment accuracy. The importance/effect of these distortions with respect to successful alignment of the wafers increases with the required alignment precision, especially for required accuracies better than 2 µm. For alignment accuracies >2 µm these distortions are small enough not to represent a significant effect on the alignment result.

These distortions constitute a problem not only in the bonding of two structures substrates, but can also lead to major problems in bonding of a structured substrate onto a largely unstructured substrate. This is especially the case if, after bonding, other process steps which require a very accurate alignment to the structured substrate are to be carried out. In particular, lithography steps in which additional layers of structures are to be aligned to structures already existing on the substrate impose high demands here. These demands rise with decreasing structure size of the structures to be produced. This application arises for example in the production of so-called "backside illuminated CMOS image sensors". Here a first wafer with the already structured surface is bonded onto a carrier wafer which is especially largely unstructured. After forming a permanent bond connection, most of the wafer material of the structured wafer is removed so that the structured surface, especially the light-sensitive sites, become accessible from the back. Subsequently this surface must be subjected to other process steps, especially lithography, in order for example to apply the color filters which are necessary for operation of the image sensor.

Distortions of these structures adversely affect the alignment accuracies which can be achieved in this lithography step. For the current generation of image sensors with a pixel size of for example 1.75 µm or 1.1 µm, the distortions allowable for an exposure field (up to 26×32 mm) of a step and repeat exposure system are roughly 100 nm, still better 70 or 50 nm.

Pre-bonding in this document designates bonding connections which after the completed pre-bonding step still allow separation of the substrates, especially of the wafers, without irreparable damage of the surfaces. Therefore these bond connections can also be called reversible bonds. This separation is conventionally possible based on the fact that the bond strength/adhesion between the surfaces is still relatively low. This separation is conventionally possible until the bond connection is permanent, i.e. no longer separable (non-reversible). This is especially attainable by the passage of a certain time interval and/or action on the wafers from the outside by means of physical parameters and/or energy. Here especially the compression of the wafers by means of a compressive force or the heating of the wafers to a certain temperature or exposure of the wafers to microwave irradiation are suitable. One example for this pre-bond connection would be a connection between a wafer surface with thermally produced oxide and a wafer surface with native oxide, van-der-Waals connections between the surfaces occurring here at room temperature. These bond connections can be converted into permanent bond connections by temperature treatment. Advantageously these pre-bonding connections also allow inspection of the bonding result before forming of the permanent bond connection. In the case of deficiencies ascertained in this inspection the substrates can be separated again and rejoined.

A simple example is a measurement device and measurement method, which enable detection of the stresses introduced by the pre-bonding step in a wafer or a wafer pair. This takes place by means of analysis of the stress maps before and after bonding. A stress difference map is produced therefrom according to the following description.

The stress difference map enables an especially empirical estimate of the distortion/strain introduced by the pre-bonding step. A distortion vector field or a distortion map/strain map is produced therefrom.

This distortion vector field makes it possible for wafer pairs in which only one of the two wafers is structured to determine which distortions were produced at certain positions, especially on the corners of the exposure field, preferably at the positions of the alignment marks for the lithography device, in addition to the deviations from the ideal shape which already exist before bonding.

The distortion vector field alternatively makes it possible, for wafer pairs with two structured wafers, to predict which additional alignment deviations can be expected at the points detected in the position maps in addition to the already theoretically expected (as a result of the selected ideal alignment positions based on the position maps of the two wafers) deviations vectors. This yields a deviation vector field or a displacement map.

This expected deviation vector field can be superimposed or added to the deviations, which have been determined based on measurements in the transparent windows. This results then in the alignment result which is to be ultimately expected for all correspondingly provided positions of the position map. With this result a decision can be made whether the joined wafers are to be separated again.

A device and a method can be devised in which
  each alignment position of the two wafers to one another can be determined, with which the set of all structures on the contact surfaces of the wafers to one another are economically and/or technically optimum to one another. This relative position can, but need not necessarily, correlate with a perfect alignment of the alignment marks to one another. Of course the alignment marks are also almost always in the optimum position, i.e. at least relative to the µm range in the immediate vicinity, but even not necessarily perfect.
  for already completed "prebond" process, therefore in a state in which it is still possible to separate the two wafers from one another, it can be checked whether the stresses produced in the pre-bonding step and the distortions which probably derive therefrom, especially mechanical distortions, are at an acceptable order of magnitude. This is used especially in applications in which only one of the two wafers is structured and the second wafer is largely unstructured.
  for already completed "prebond" process, therefore in a state in which it is still possible to separate the two wafers from one another, it can be checked whether the accuracy of positioning of the two wafers or of the individual structures of the wafers to one another also in fact correspond to specifications. In this way, the displacements which occur as the wafers mutually approach one another in the direction of the z-axis, or even worse, deviations from the ideal position which occur during the contact process, can be determined. In particular, as a result of detecting the stresses introduced in the pre-bonding step, predictions of the expected distortions and the resulting deviations from the ideal position can also be estimated, especially empirically.

With this device and this method alignment accuracies of <25 µm, especially <0.15 µm, preferably <0.1 µm can be accomplished with good reliability and yield by the above described distortions being controllable and correctable optionally before producing the final bond connection.

In other words, the device therefore makes available at least means for detecting the stress properties of the wafers before and/or after the pre-bonding step. Based on the knowledge of these stress properties and especially a comparison of the stress properties before and after the pre-bonding step, predictions can be made about strains/distortions which have been introduced into the wafer during the pre-bonding step.

Especially for the inspection and/or alignment of two structured wafers, the device can make available means for detecting the movement of the substrates, especially solely in one X and Y direction which are referenced to at least one fixed, especially locally fixed reference point and thus enable exact alignment of the corresponding alignment keys at least in one X and Y direction, not only with reference to the positions of the individual structures, but also with respect to the strain and/or stress properties.

The economically and/or technically optimum alignment of all structures of the two wafers to one another can be determined, measured and/or checked. This comprises the recording of a position map of the structures of the two wafers before the wafers are brought together, and a continuous, especially in-situ monitoring process of the displacement of the two wafers via alignment marks. For faulty prealignment and prebond the generally very expensive structure wafers can be again separated from one another and re-aligned.

The apparatus can be made to take into account first position maps of first alignment keys and/or second position maps of second alignment keys, especially in the determination by evaluation means. Alignment keys are especially the alignment marks and/or structures applied to the substrates or one of the substrates.

The stress and/or strain maps are recorded either from the respective inspection side by reflection measurement, the radiation being reflected. In particular an average value of the stress/strain over the layer thickness is not enabled, but information about regions near the surface, light infrared or from the respective back by transmission measurement is enabled as claimed in the invention. In measurement with infrared light or x-ray an average value of the stress or strain over the detectable layer thickness is determined. A stress-strain map is not necessarily recorded through the transparent regions. The position maps are determined especially solely by reflection measurement, preferably by using visible light. The first and second alignment keys can be detected at the same time, especially with the same detection means, by the aforementioned measures.

The alignment of the substrates during contacting and/or bonding of the substrates can be checked, especially in-situ. The in-situ checking entails the advantage that alignment errors caused especially by movement of the substrates during contact or bonding can be precluded.

To the extent four corresponding alignment keys are provided for checking, checking taking place especially through transparent regions, simultaneous in-situ monitoring of the relative position of the substrates to one another can also take place.

The basic idea of this invention is to provide a receiving means comprised of several active control elements which are independent of one another and with which the mounting surface of the receiving means can be influenced, especially in shape and/or temperature. Here, the active control elements are used by the corresponding activation such that the local alignment errors or local distortions which are known by means of the position maps and/or strain maps are compensated or for the most part minimized or reduced. Not only are local distortions eliminated, but a macroscopic distortion or stretching of the wafer which arises from the local distortions altogether in its outside dimensions is at the same time minimized or corrected.

Thus, as claimed in the invention, especially in combination with the above described inventions relating to the position maps, strain maps and/or stress maps and the in-situ correction of alignment faults disclosed there during contact-making and bonding of the wafers, it is possible to achieve a still better alignment result by active, especially local action on distortions of the wafer.

According to one advantageous embodiment of the invention, the temperature of the mounting surface can be locally influenced by the compensation means. A local temperature increase of the mounting surface leads to local expansion of the wafer which is held on the mounting surface at this position. The higher the temperature gradient, the more the wafer expands at this position. Based on the data of the position maps and/or strain maps, especially the vector evaluation of the alignment error, especially for each position of the position maps and/or strain maps, it is possible to act on local wafer distortions or to counteract them in a controlled manner.

In this connection vector evaluation is defined as a vector field with distortion vectors, which field has been determined especially by means of one of two versions of the invention described below.

The first version relates to applications in which only one of the two wafers is structured. In this case, it is provided as claimed in the invention that the deviation of the structures is detected, especially the deviation of the geometrical shape from the desired shape. In this case, the deviation of the shape of exposure fields, especially exposure fields of a step & repeat exposure device, from the nominally expected shape which is conventionally rectangular is of special interest. These deviations, especially the vector field which describes these deviations, can take place based on the detection of a position map of the individual alignment marks which correspond to the exposure fields according to EP 09012023 (US 2012/0237328 A1). Alternatively, this vector field can also be determined based on stress maps and/or strain maps which are acquired by means of EP 10 015 569.6 (US 2012/0255365 A1). Advantageously this vector field can however, as claimed in the invention, also be determined by any other suitable measurement means and can be read in. In particular, step & repeat lithography systems which are operated for acquisition of these data with a special test mask and/or a special test routine are suitable for this measurement.

The second version relates to applications in which two wafers are structured. In this case, it is provided as claimed in the invention that the vector field of the alignment deviation be computed for all positions of the position maps, especially of the first and second position maps according to EP 09012023 (US 2012/0237328 A1). This vector field is to be determined especially for the alignment position which is considered ideal according to technological and/or economical criteria according to the material in EP 10 015 569.6 (US 2012/0255365 A1).

In another advantageous embodiment of the invention, it is provided that the strain of the mounting surface can be locally influenced by the compensation means, especially by arrangement of piezoelements which can preferably be individually activated on one back of the mounting surface. By stretching or shrinkage, therefore negative stretching, the mounting surface, also the wafer, is deformed accordingly, especially stretched or shrunk, especially by the mounting force acting from the mounting surface on the wafer, wherein the wafer can be influenced in a controlled manner by a corresponding control means based on the values of the strain map which has been determined for this wafer. To the extent the shape of the mounting surface can be locally influenced by the compensation means, especially by preferably mechanical action in one Z direction, there is another possibility for counteracting distortions of the wafer on the mounting surface. Here it also applies that the control of the compensation means takes place by a control means which undertakes a correspondingly dedicated local control of the compensation means based on the values of the position maps and/or strain maps.

The control means encompasses especially software for executing/computing corresponding routines.

According to another advantageous embodiment of the invention, it is provided that the mounting surface can be locally exposed to pressure from the back of the mounting surface, by the compensation means, especially hydraulically and/or pneumatically. In this way the shape of the mounting surface can likewise be influenced so that the aforementioned effects occur. Control likewise takes place again by the above described control means.

Advantageously the compensation means are provided as a plurality of active control elements in the receiving means, especially integrated, preferably embedded into the mounting surface. Thus a receiver of the receiving means can be made monolithic, as is likewise the case in the known receiving means.

Here it is especially advantageous if each control element or groups of control elements can be activated separately. Accordingly, local activation means that a small extract, especially an extract smaller than half the wafer, preferably smaller than $\frac{1}{4}$ of the wafer, preferably smaller than $\frac{1}{8}$ of the wafer, even more preferably smaller than $\frac{1}{16}$ of the wafer, can be locally activated by the compensation means. It is especially advantageous if the compensation means can act on each region of the wafer occupied by its own structure with at least one control element.

The device as claimed in the invention comprises the above described control means advantageously in a central control unit which is responsible for all control processes. But, as claimed in the invention, it is conceivable to provide the control means in the receiving means, especially as a module of an overall device.

The method as claimed in the invention can be still further improved by there being one, especially repeated, acquisition of position maps and/or strain maps of the first and/or second wafer after the alignment. Thus, as claimed in the invention after completed alignment, there can be checking of the alignment success. Accordingly, it is conceivable to eliminate a wafer pair with overly large alignment errors in order, for example, to align them again as claimed in the invention or to dispose of them. At the same time the acquired data can be used for self-calibration of the device, especially by the control means.

The inventions disclosed in European patent application EP 09012023.9 (US 2012/0237328 A1) and/or the European patent application EP 10 015 569.6 (US 2012/0255365 A1) will be considered as concomitantly disclosed at the same time as embodiments for this invention.

Other advantages, features and details of the invention will become apparent from the following description of preferred exemplary embodiments and using the drawings.

BRIEF DESCRIPTION OF THE DRAWINGS

FIG. 3b shows a cross sectional view of the receiving means according to cutting line C-C from FIG. 3a, FIG. 4a shows a plan view of a receiving means as claimed in the invention in a fourth embodiment, FIG. 4b shows a cross sectional view of the receiving means according to cutting line D-D from FIG. 4a.

FIG. 6b shows a schematic view of the process step of detecting a second wafer as claimed in the invention, FIG. 6c shows a schematic view of the in-situ detection of the alignment of the wafers as claimed in the invention when the wafers make contact, FIGS. 9a to 9c show one alternative method for detecting the alignment of a wafer pair and FIG. 10 shows a schematic of the determination of a displacement map as claimed in the invention.

DETAILED DESCRIPTION OF PREFERRED EMBODIMENTS

The same components/features and components/features with the same action are identified with the same reference numbers in the figures.

Figure 5A:
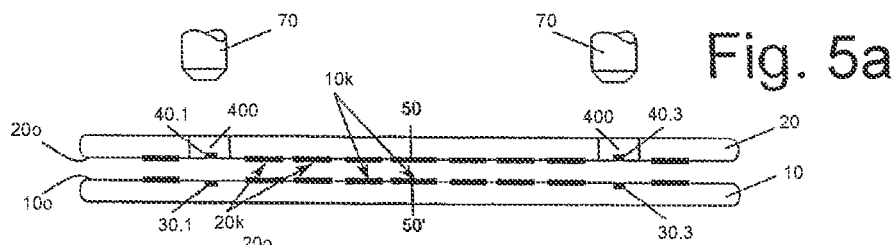
FIG. 5a shows a schematic cross sectional view of a wafer pair which has been aligned as claimed in the invention.
Figure 5B:
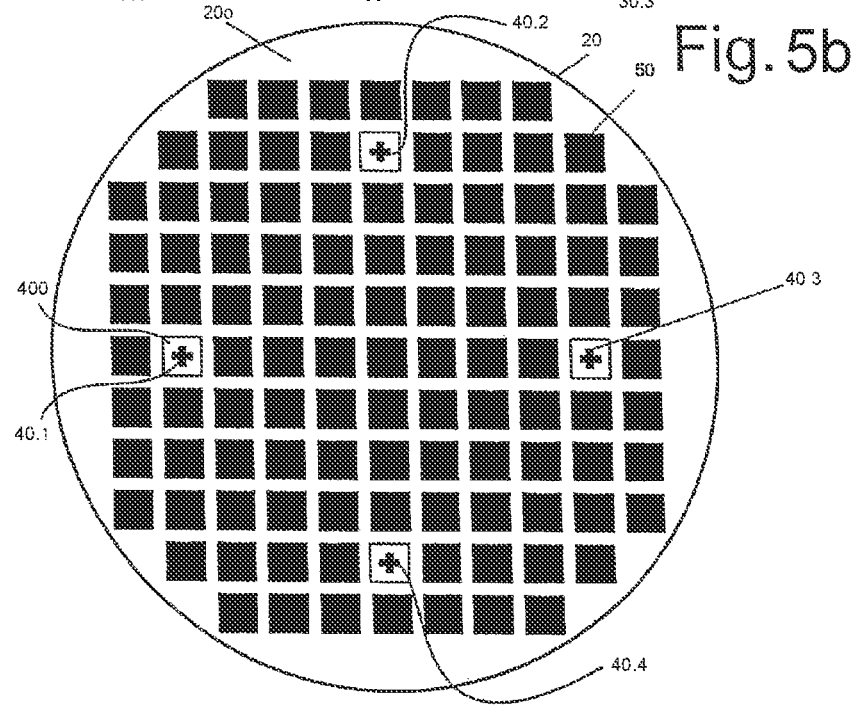
FIG. 5b shows a schematic aspect of an upper wafer of the wafer pair according to FIG. 5a, FIG. 5c shows a schematic aspect of a lower wafer of the wafer pair according to FIG. 5a, FIG. 6a shows a schematic view of the process step of detecting a first wafer as claimed in the invention.
Figure 5C:
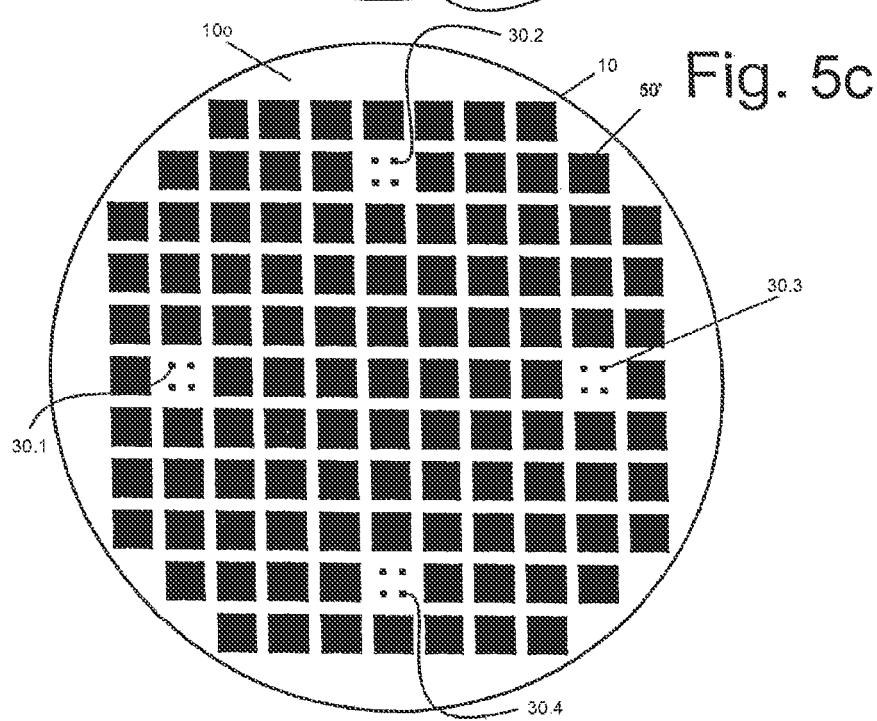

FIG. 5a shows a typical wafer system consisting of a first substrate 10, especially a wafer 10, with a surface 10o, and a second substrate 20, especially a wafer, with a surface 20o. On the surfaces 10o, 20o are different structures 50, 50' which are to be bonded to the contact surfaces 10k, 20k. The structures 50, 50' can be for example cavities in which there are MEMS devices. In the case of 3D integrated chip stacks the structures could also be metal surfaces which are used for producing electrical connections. For the sake of simplicity the structures 50, 50' are shown as black rectangles. FIGS. 5b and 5c show the surfaces 10o, 20o of the two wafers 10, 20. The wafer 20 has four regions 400 with second alignment keys 40.1 to 40.4.

The regions 400 are transparent to electromagnetic radiation of a certain wavelength or a certain wavelength range. A first detection means 70, especially optics, can correlate the first alignment keys 30.1 to 30.4 of the first wafer 10 with the corresponding second alignment keys 40.1 to 40.4 through the transparent regions 400. Advantageously these transparent regions can be made available for silicon wafers by doping of the silicon being avoided for these regions or especially the degree of doping being kept relatively low and no metal layers being applied in these regions or especially relatively few metal structures being produced. This can be achieved for example in that only the alignment marks and possible pertinent structures which can consist especially of metal are placed in the transparent regions. With adherence to these prerequisites silicon is transparent to infrared light with a wavelength of >1 μm, especially >1050 nm.

The structures 50, 50' can project over the surfaces 10o, 20o or can be set back relative to them, for which reason the contact surfaces 10k, 20k need not coincide with the surfaces 10o, 20o of the wafers 10, 20.

Alignment keys 30.1 to 30.n or 40.1 to 40.n can be also be the structures 50, 50' or parts of the structures 50, 50'.

The method begins with the recording of the position maps. A position map is defined as the position detection, spatially as complete as possible, of as many structural elements as possible, especially of the first and/or second alignment keys 30.1 to 30.n or 40.1 to 40.n and/or structures 50, 50' or parts of the structures 50, 50' on the surface of the wafers 10, 20.

FIG. 6a shows the position detection of the surface 10o of the first wafer 10 by the optics 70, therefore the recording of a first position map. Positions of the first alignment keys 30.1 to 30.4 are measured on the top 10o of the wafer 10 by either the wafer 10 being moved relative to the optics 70 or the optics 70 being moved relative to the wafer 10. In one preferred embodiment the optics 70 are fixed, while the wafer 10 is moved relative to the optics 70, fixed on the recording means 12.

In a second step which especially follows the first step or which proceeds simultaneously with it, according to FIG. 6b the same process is carried out with the top 20o of the second wafer 20 by means of a second detection means, especially optics 80.

Since in this measurement process the recording of the position map is what is important, it would also be conceivable to use only the optics 70 as the detection means, therefore to omit the optics 80, and to measure the two wafers 10, 20 with their structured tops 10o, 20o in the direction of the optics 70. For later alignment and bond step then one of the two wafers 10, 20 would be flipped and fixed on its recording means 12 or 22.

According to the above described steps, the device now knows the X-Y positions of all recorded structures 50, 50' or recorded first and second alignment keys 30.1 to 30.n and 40.1 to 40.n on the tops 10o, 20o of the wafers 10, 20, especially also the positions of the structures 50, 50' relative to the first and second alignment keys 30.1 to 30.n and 40.1 to 40.n. They are stored in the form of a first position map for the first substrate 10 and in the form of a second position map for the second substrate 20.

During the measurement step, not only the first and second position map, but especially in different modules or at the same time in one module, also first and second initial strain and/or first and second initial stress maps will be recorded and are representative of the basic stresses or initial stresses of the substrates 10, 20. Here it is the recording of strain and/or stress values as a function of the X-Y position according to the position map. Each measurement device which is able to determine stresses and/or strains locally resolved, can be used, especially infrared measuring devices. Measurement devices which are based on Raman spectroscopy are especially advantageously used. Alternatively as claimed in the invention the infrared method "Grey-Field Polariscope" Review of Scientific Instruments 76, 045108 (2005) "Infrared grey-field polariscope: A tool for rapid stress analysis in microelectronic materials and devices" can be used. The stress and/or strain maps are recorded in turn by relative motion of the optics 70, 80 to the wafers 10, 20. In one advantageous embodiment there is separate optics or optics additionally integrated in the optics 70, 80.

To the extent only strain maps or only stress maps are prepared for optimization of the detection time, the stress map can be converted into the corresponding strain map by means of the fundamental equations of elasticity theory and vice versa. A mathematical, especially numeric conversion, preferably with starting points according to the method of finite elements is conceivable.

For devices which have been optimized for the especially precise detection of the position maps and/or strain maps, two different detection means are used for detection of the position maps and/or stress maps.

For exclusion of other fault sources it is provided that the stress and/or strain maps are detected according to the alignment of the substrates 10, 20.

The respective detection means for recording the position maps in one advantageous configuration at the same time comprise the detection means for detection of the stress and/or strain maps so that movement of the respective detection means with the same drive takes place.

Alternatively, for the accelerated and in this respect more cost favorable embodiment it is conceivable to provide detection of the stress and/or strain maps in one or more separate modules, especially with respectively separate wafer handling means, preferably robot arms.

Figure 7:
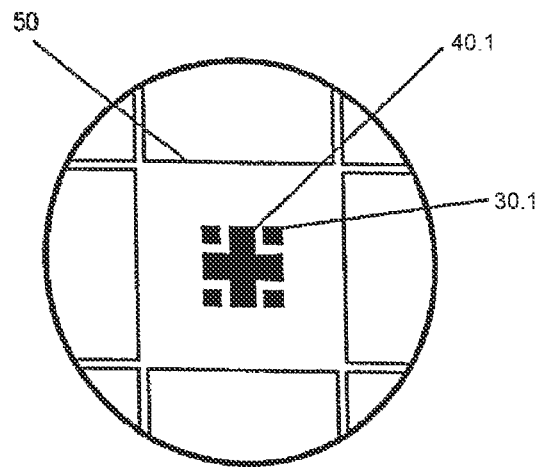
FIG. 7 shows an enlargement of one alignment mark for a perfectly aligned and contacted wafer pair.

FIG. 7 shows perfectly aligned first and second alignment keys 30.1 to 40.1, as well as perfectly aligned structures 50, 50', the structure 50' being covered by the structure 50 due to the perfect overlapping. The case is unrealistic in which all structures 50, 50' on the two wafers 10, 20 with reference to the alignment keys 30.1 to 30.n and 40.1 to 40.n have been produced so perfectly that in a perfect bond process the state from FIG. 7 results. In actuality the structures 50, 50' cannot be so exactly produced. Even if they were so perfectly produced, the wafers 10, 20 during the approach process or while "coming into contact" could move relative to one another. In the pre-bonding step additional strains can also be introduced into the wafer which lead to strain/distortions and as a further consequence to deviations from the ideal alignment. A perfect alignment at individual positions is accordingly not necessarily the objective. Rather, care should be taken that all corresponding structures 50, 50' on the wafers 10, 20 are aligned altogether with regard to economic and/or technical aspects such that for each wafer pair which is to be bonded and aligned dice scrap is as little as possible.

Since the positions of all detected structures 50, 50' and/or of the first and second alignment keys 30.1 to 30.4 and 40.1 to 40.4 of the two wafers 10, 20 are known, the optimum relative position of the wafers 10, 20 or of all structures 50, 50' to one another can be determined by computation means. This takes place by determining a first alignment position of the first contact surface 10k and a second alignment position of the second contact surface 20k based on the values of the first position map and based on the values of the second position map. This relative position of the wafers 10, 20 to one another and/or the first and second alignment position can be continuously checked in-situ for correctness during and also after contacting and during as well as after the bonding process by the optics 70 and through the transparency regions 400. In this way the alignment can be checked in-situ.

The optimum relative position of the two wafers 10, 20 or of the structures 50, 50' to one another arises for example by computing a minimum sum of the especially quadratic deviations of the respectively corresponding structures 50, 50' from one another.

It is likewise conceivable to allow economic aspects to also be included in this computation of the ideal alignment position. Thus, in many areas of the semiconductor industry, especially in the memory industry (for example, RAM, NAND Flash) it is conventional that chips on certain regions within the wafer, especially in the region of the wafer center, have less variance of the quality-relevant parameters. Therefore the chips which originate from this region attain higher sales prices so that the sorting process in which these chips are intentionally divided into different quality baskets is taken into account (this process is known as "binning"). Advantageously therefore as claimed in the invention the ideal alignment position of the wafers is computed not only based on the position maps of the two wafers, but an economic computation/weighting is also included here, in which especially care is taken to achieve a higher yield in the area of the higher quality chips, especially at the cost of a lower yield in the region of the lower value chips.

Figure 8:
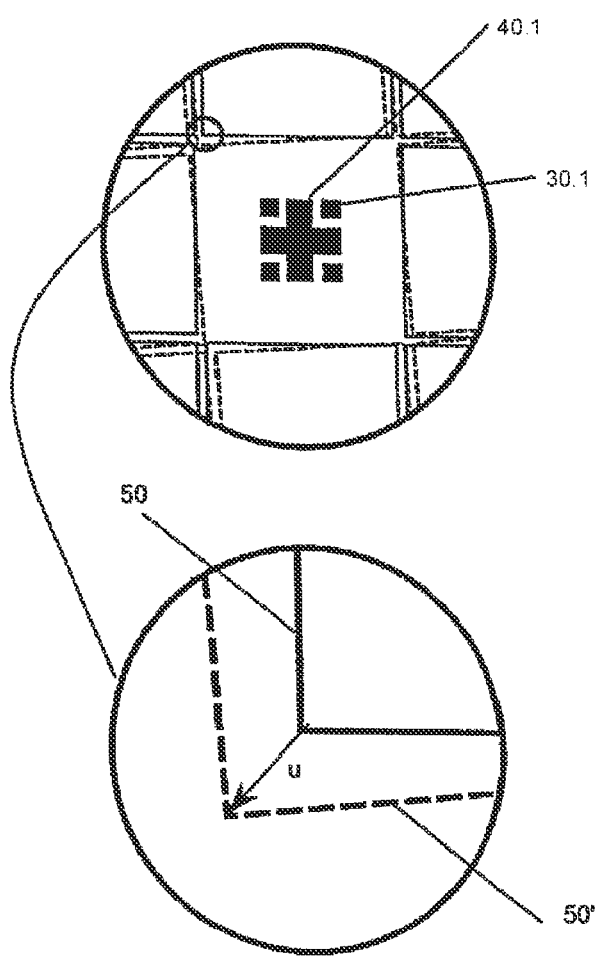
FIG. 8 shows an enlargement of one alignment mark for an imperfectly aligned and contacted wafer pair with an enlargement of corners of two structures of the wafer pair which are to be aligned to one another.

FIGS. 8 and 10 show a difference vector u which constitutes the difference of the X-Y positions of the corners of an upper structure 50 from those of a corresponding lower structure 50'. The difference vector u arises for example from the minimization computation of the position maps. Of course in each of the transparent regions 400 its own difference vector u can be recognized. If at this point the two wafers approach one another, the difference vectors u are continuously checked. If they change, during the approach or during contacting or bonding, a deviation from the determined relative position of the two wafers 10, 20 to one another takes place. Even if the two wafers 10, 20 make contact, the optics 70 can still check at least the four difference vectors u through the transparency regions 400. If after contact a deviation should be effected which is too large, the wafers 10, 20 are immediately separated in order to carry out alignment and the prebond process again. In order to implement a simultaneous checking of several transparency regions 400, for each transparency region 400 there is its own optics 70 so that the throughput during bonding is not reduced by the in-situ detection of the alignment.

Alternatively it is also conceivable to carry out the checking step after pre-bonding in a separate module, so that the throughput of the alignment means and of the pre-bonding module is not reduced. The possible separation of the wafers after the checking step can take place either in the module intended for checking or however likewise in a separate module. It is also conceivable that not all modules are connected in a single device, but form separate devices, especially with wafer handling means which are separate at the time.

FIG. 7 shows in an enlargement the near region of the alignment marks 30.1 and 40.1. In order to be able to detect the structures 50 and 50' during superposition, only the edges have been shown. If at this point the structures 50 and 50' were oriented perfectly to one another, and perfectly to the alignment marks 30.1 and 40.1, a perfect covering of the two structures 50 and 50' would be established in a bond process.

FIG. 8 shows the sample case in which there is no coverage of the structures 50 and 50', although the alignment marks 30.1 and 40.1 have been perfectly aligned to one another. In the enlargement of the structure 50 and the corresponding structure 50' it is recognizable that the difference vector u has one X- and one Y-component which can be used for vector computation.

The aforementioned measurement instruments or measurement instruments provided in a separate module can be used for stress and/or strain measurement after prebonding or bonding in order to determine the stress and/or strain maps of the bonded wafer stack. By measuring the initial stress and/or initial strain maps of the wafers 10, 20 before bonding of the two wafers 10, 20 to the wafer stack and the measuring the stress and/or strain maps of the wafer stack, conclusions can be drawn about the deformation at the instant of contact or shortly afterwards can be drawn. In other words, therefore the stress introduced by the pre-bonding process can be measured and the resulting stress/distortion can be determined/estimated/predicted or advantageously computed, especially based on empirically determined relationships.

Although the inner regions of the wafers 10, 20 can no longer be viewed with the optics 70, 80, since there are no transparent regions in this region, conclusions can be drawn about the state, the position or the deformation in this region by the strain and/or stress maps. If for example in one region a stress prevails which exceeds a critical value, for example the value of a comparison stress, this region can be automatically marked as a problem zone by software. The dices could thus be divided into quality classes. Dices with low inherent stresses have a good quality class as well as long service life, while dices with high stress concentration can be classified into a low quality class.

Based on these stress/strain maps, for the entire wafer surface and all structures present on it the alignment accuracy which has been achieved is estimated and empirically determined. This can be done as follows in practice.

1) Detecting the first and second position maps, corresponding to the first and second wafers as described above.
2) Computing the ideal alignment position based on this first and second position map according to technical and/or economic criteria. This computation likewise yields the ideal alignment positions and the corresponding deviation vectors for the alignment marks in the transparent regions 400. That is, the alignment marks in the transparent regions 400 need not necessarily be perfectly aligned in order to achieve the optimum result viewed for the entire wafer. Furthermore, based on this computed desired alignment position a two-dimensional difference vector field v' which can be expected for this reason (see FIG. 10) with individual difference vectors for at least the predominant number, preferably all positions contained in the position maps, is computed. Here preferably sites at which there are no structures 50, 50' are left out in order not to adulterate the measurement result. They are for example the locations of the alignment keys 30.1 to 30.4 and 40.1 to 40.4 since there are alignment marks there instead of structures 50, 50'.
3) Detecting the first and second initial stress map corresponding to the first and second wafer before the pre-bonding step, especially parallel to detection of the first and second position map.
4) Pre-bonding of wafers with a suitable method. These methods are known in basic form to one skilled in the art for the most varied bonding connections.
5) Detecting the actual alignment accuracy in the transparent regions 400 and determining the actual deviation vectors u in the transparent regions 400.
6) Determining the difference between the actual deviation vectors u from the computed deviation vectors for the transparent regions.
7) With consideration of the determined difference the resulting difference vector map v" can be computed in which for at least the predominant number, especially for each position contained in the first and second position map, there is a deviation vector. These deviation vectors u which correspond to the individual position are now adapted by a correction vector which is computed for each individual position based on the deviation vectors determined under item 60 and the coordinate position of the respective point and the coordinate positions of the transparency fields.
8) Detecting the first and second stress map after pre-bonding.
9) Comparing the first stress map before and after the pre-bonding and the second stress map before and after the pre-bonding.
10) Predicting the additional alignment errors/deviation vectors which can be expected for individual points based on the stress differences before and after the pre-bonding.
11) Adding the additional deviation vectors caused by the stress introduced in the pre-bonding to the deviation vectors which can be theoretically expected and which were computed in point 7.
12) Deciding whether the alignment accuracy to be expected here in the vector field predicted based on the computation in point 11 for the deviation vectors in the individual points corresponds as before to technological and economic success criteria or whether reprocessing/separation of the wafers is to be carried out.

For wafer stacks in which one or both wafers before pre-bonding have only low or especially no initial stresses or for which the initial stress before bonding is known because it is subject for example to only very low variance in mass production, on step 3, the detection of stress maps before bonding for purposes of optimization of the throughput and the costs can be omitted. It is also possible, especially in the case of stresses which are subject to only a low variance to subject only one part of the wafer to detection of the stress maps before bonding. In this connection, low stresses are defined as stress values which are insignificant compared to the stresses produced in the pre-bonding step. This is especially the case when the stresses differ by the factor 3, preferably by the factor 5 or even better by the factor 10. With respect to only partial measurement of the wafer stack it is especially feasible for example to subject the first and the last wafer stack of a batch to inspection and for the remaining wafer stacks to adopt the stress map determined for the first wafer stack for the computations. It is also conceivable to carry out the computations offset in time in order to then base the computation on the averaged stress maps for example for the first and last wafer stack. In this case it is also advantageously possible to additionally inspect other wafer stacks in order to achieve higher reliability in the computation of the average value. According to the described procedure it is also possible to subject only one of the two wafers which form the wafer stack to detection of the stress maps. This is especially advantageous when only one of the two wafers does not meet the above described criteria which justify the omission of stress map detection.

For applications in which only one of the two wafers is structured the method can proceed similarly to bonding of two structured wafers. Specifically the process is as follows in this embodiment:

1) Detecting the already existing distortion/deviation vectors of the individual exposure fields located on the structured wafer from the ideal shape by suitable detection means. In particular step and repeat exposure system which are also intended for later processing of the bonded wafer enable this measurement with the aid of suitable devices such as test masks. This deviation from the ideal shape is represented in the form of a vector field and is stored for further computation. In particular this vector field contains vectors for a major part, especially all positions of the alignment marks, which are conventionally located on the corners of the exposure fields.
2) Detecting the initial stress map of the structured wafer before the pre-bonding process by suitable detection means from the side opposite the contact surface $10k$ (if wafer 10 is the structured wafer) or $20k$ (if wafer 20 is the structure wafer).
3) Alignment of the two wafers to one another with the aid of suitable detection means for the wafer position and alignment means.
4) Pre-bonding of the two wafers.
5) Detecting the stress map of the structured wafer after the pre-bonding step by means of suitable detection means from the side opposite the contact surface $10k/20k$.
6) Determining the difference between the stress map before the pre-bonding step and after the pre-bonding step.
7) Deriving the distortion vectors to be expected/the distortion vector field to be expected based on the stress difference determined in point 6. Advantageously the vectors in this vector field are determined for positions which correlate with the positions of the vectors from the vector field which has been determined in point 1, especially at least largely agree. Advantageously this agreement is better than 500 µm, but more ideally better than 200 or 70 µm.
8) Adding the distortion vector field with the vector field determined in point 1.
9) Checking whether the vector field resulting from the computation in point 8 corresponds as before to technological and economic success criteria or whether separation and reprocessing of the wafers are to take place.

The aforementioned statements with respect to omitting the detection of stress maps before bonding or the only partial detection of the stress maps for selected wafers and/or wafer stacks apply analogously here.

Deriving the distortion vector field from the stress maps and especially the maps for the stress difference between, prior to and after pre-bonding can take place as claimed in the invention based on a plurality of suitable methods. It is apparent from the detection of stress maps and especially the stress difference beforehand/afterwards whether in certain regions of the wafer a pressure or tensile stress during bonding has been additionally produced. On this basis conclusions can be drawn about the direction of the individual vectors at any point of the wafer. The level of the stress difference in the individual regions which is likewise known from the measurements and/or the computation allows conclusions about the amount of the vector. These relationships are however not necessarily linear since the individual component regions of the wafer are conventionally surrounded by other regions which additionally influence the strain/distortion of the wafer. Therefore complete computation models which are suitable in practice must be used to be able to estimate the actual amounts and directions of the vectors. Another possibility for certain outline conditions (certain stress values, etc.) is also the use of empirical methods in which the findings from tests done in the past are exploited.

Without transparent regions 400 the in-situ measurement of the alignment during contacting and/or bonding is limited to the measurement of the strain and/or stress fields, as is shown in FIGS. 9a to 9c. The examples of FIGS. 9a to 9c show a method and a device in which instead of two wafers 10, 20 which are both completely structured, one structure wafer 20' is aligned relative to a carrier wafer 10'.

The alignment marks 30.1 to 30.n are correlated with the alignment marks 40.1 to 40.n by already known optical systems being used. The optics 70 and/or 80, if they have the corresponding sensor means which were mentioned above, can be used for measurement of the strain and/or stress fields. The stress and/or strain field on the top 20o of the wafer 20 can be measured either by the optics 80 while the carrier wafer 10 has been removed from the visual region (FIG. 9b) or by the optics 70, if the electromagnetic radiation used can penetrate the structure wafer 20'. It must be considered by the computation means that in the transmission measurement by the optics 70 an averaged strain and/or stress value can be obtained if the stress along the layer thickness changes (so-called stress gradients in the layer thickness). For the measurement of the strain and/or stress fields on the surface 10o of the carrier wafer 10', the above described applies, the necessary changes having been made, according to FIG. 9c.

After the respective initial strain and/or stress fields have been measured, the two wafers 10', 20' can be aligned and bonded. After the bond is completed, the strain and/or stress fields are determined by means of the optics 70 and/or 80. After bonding, only one more transmission measurement of the strain and/or stress fields of the surfaces 10o, 20o is possible since the electromagnetic radiation must penetrate the two wafers 10', 20'. Therefore the aforementioned differentiation between transmission and reflection measurement is preferred. For better comparability, the transmission measurement is preferred. If transmission measurements and reflection measurements should yield similar strain and/or stress maps, it can be concluded that the strain and/or stress fields are only on the surfaces 10o, 20o and there are no stress gradients over the thickness. The beforehand/afterwards comparison then in turn allows a conclusion about the change of the strain and/or stress fields and a conclusion about possible weaknesses of the system. If extreme strain and/or stress regions or those exceeding a comparison value are discovered, the wafer system can again be broken down into the individual wafers before they are permanently bonded to one another.

For structured wafers which are not transparent to the electromagnetic waves used to detect the stress maps, a reflection measurement can be preferred since thus the transparency of the structured surface of the wafer, especially the contact surface $10k$ or $20k$, does not play a part. For these wafers with the absence of transparency the stress can also be advantageously measured on the surfaces opposite the surfaces 10o and 20o. In order to achieve better comparability of the measurement results, it is a good idea to measure both before and after the pre-bonding and/or the bonding step on these surfaces. Since the stress fields in the wafer viewed in the lateral direction compared to the wafer thickness have a must larger extension, this version of the measurement also yields very good results. In particular, the circumstance that lateral stress fields with a certain minimum extension are needed to cause significant distortions benefits the accuracy. It can be expected that stress fields in the lateral direction (X/Y) must have at least 3 to 5 times, probably even 10, 15 or 20 times the extension relative to the wafer thickness to lead to relevant strains/distortions.

The most important wafer material combinations which can be used are: Cu—Cu, Au—Au, hybrid bonds, Si, Ge, InP, InAs, GaAs; and combinations of these materials and the respectively assignable oxides for materials which allow this.

The position, strain and stress maps all relate advantageously to the same X-Y coordinate system. Thus the vector computation is simplified, especially in the determination of the first and second alignment positions and the determination of the displacement map according to FIG. 10.

All four embodiments in FIGS. 1a-4b show a monolithic receiver 1 which, as a flat, preferably circular ring-shaped plate, is provided with a flat mounting surface 1o for receiving and mounting of wafers. On the outer periphery the receiver has a ring-shaped shoulder 1a.

The mounting surface 1o forms a receiving plane for receiving the wafer, which plane extends in the X and Y direction. The Z direction, in which the mounting force acting on the water is pointed, runs perpendicular to them. Mounting of the wafer takes place through openings 2 which are arranged uniformly distributed in a plurality over the mounting surface 10 in order to be able to hold the wafer on the mounting surface 1o by applying negative pressure to the openings 2. The larger the number of openings 2 and the smaller the diameter of the openings 2, the less the negative pressure prevailing on the openings 2 for mounting of the wafer leads to distortions of the wafer on the openings 2.

The negative pressure on the openings 2 is applied via a vacuum means which is not shown and which applies negative pressure to an interior space 1i located on the back side of the mounting surface 1o. The interior space 1i is furthermore bordered by a peripheral wall 1w of the receiver 1 and is sealed relative to the vicinity. The openings 2 extend from the mounting surface 1o as far as the interior space 1i and can thus be uniformly exposed to the negative pressure prevailing in the interior space 1i.

The interior space 1i is furthermore bordered by the back 1r located opposite the mounting surface 1o and by the bottom of the interior space 1i which is not shown, the back 1r being penetrated by openings 2.

On the back 1r the active control elements are a plurality of heating/cooling elements, especially exclusively heating elements 3. The heating elements 3 are each activated individually or in groups, control taking place by a control means which is not shown. When one of the heating elements 3 is heated, a local section of the mounting surface 1o is heated by the material with very good heat conduction, especially metal, of the receiver. This leads to local expansion of a wafer which lies on the mounting surface 1o in this region. Thus, for wafers which are held aligned accordingly on the receiving means and with a known position of possible distortions/strains, a deformation of the wafer can be caused in a controlled manner by switching individual or several heating elements 3 in order to compensate for local distortions. Especially for a plurality of local compensations, this also yields global compensation of global distortions, especially a change of the diameter of the wafer in the X and/or Y direction.

One special advantage of influencing the distortions on the wafer by means of the heating and/or cooling elements lies in the possibility of being able to achieve this with minimum deformation, especially without deformation of the mounting surface and/or especially without deformation of the wafer in the vertical direction or Z direction. In this connection, minimum deformation should be considered to be deformation of the mounting surface and especially of the wafer in the vertical direction or in the Z-direction relative to the support surface of <5 µm, advantageously <2 µm, preferably <1 µm and even more preferably <0.5 µm.

This is especially advantageous for production of pre-bonding interconnections, for example for prebonds, which are based on van-der-Waals bonds. Based on the fact that here the mounting surface and especially the wafer can be kept flat, the bond wave which is conventional in these prebonding steps is not influenced in its propagation by unevenness. Thus the risk that unbonded sites (so-called voids) remain is greatly reduced. For producing these pre-bonding interconnections, as claimed in the invention evenness of the mounting surface of <5 µm, advantageously <2 µm, preferably <1 µm and even more preferably <0.5 µm over the entire wafer surface is desired. These evenness values are defined as the distance between the highest and the lowest point within that part of the mounting surface which is in contact with the wafer.

The heating elements 3 are advantageously uniformly distributed under the mounting surface 1o. Advantageously there are more than 10 heating elements 3, especially more than 50 heating elements 3, preferably more than 100 heating elements 3, even more preferably more than 500 heating elements 3, in the receiving means. These heating elements form regions which can be separately activated in the mounting surface and which enable local action on the wafer. Advantageously the individual regions of the mounting surface are thermally insulated from one another with suitable means. In particular, the regions are made in a form which enables a uniform and closed arrangement of the individual segments. Advantageously the execution of the segments as triangles, squares or hexagons is suitable for this purpose.

In particular, Peltier elements are suitable as heating elements 3.

Figure 1A:
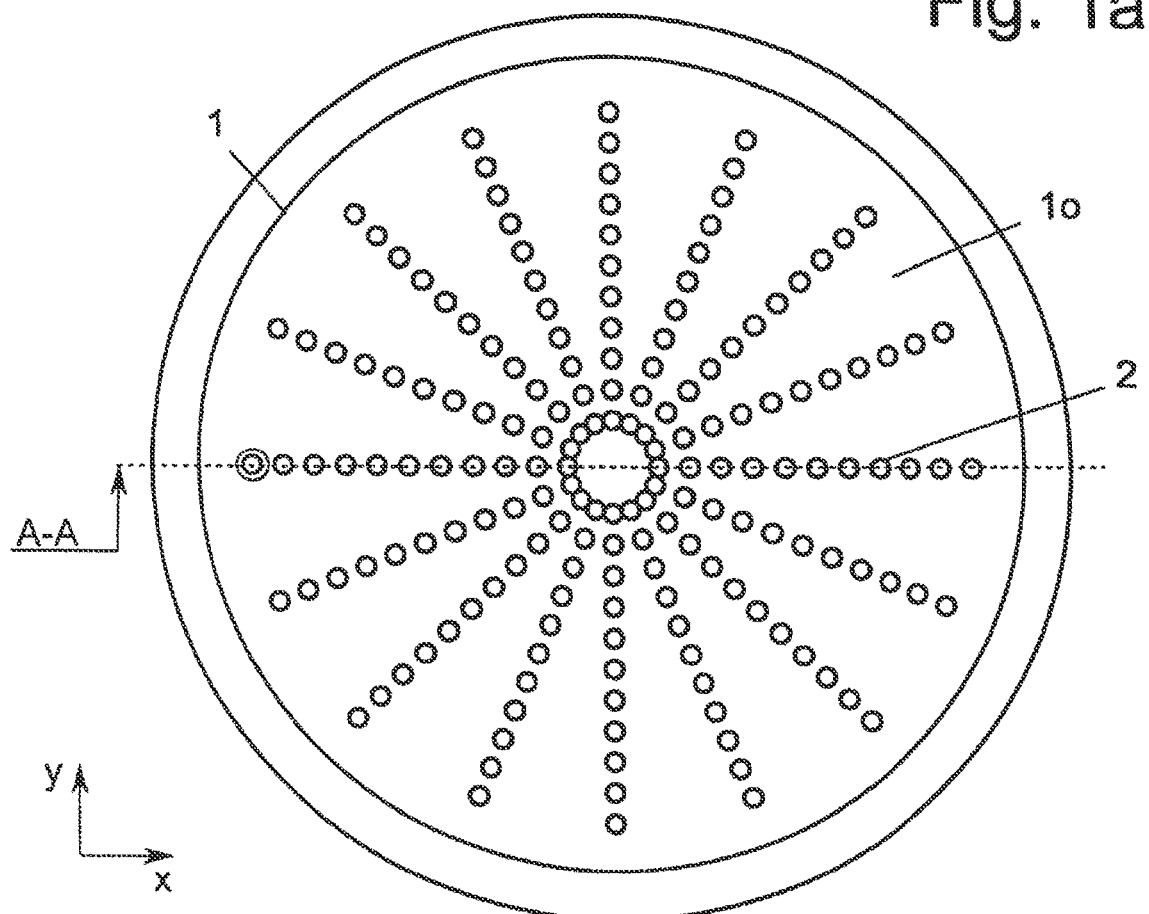
FIG. 1a shows a plan view of a receiving means as claimed in the invention in a first embodiment.
Figure 1B:
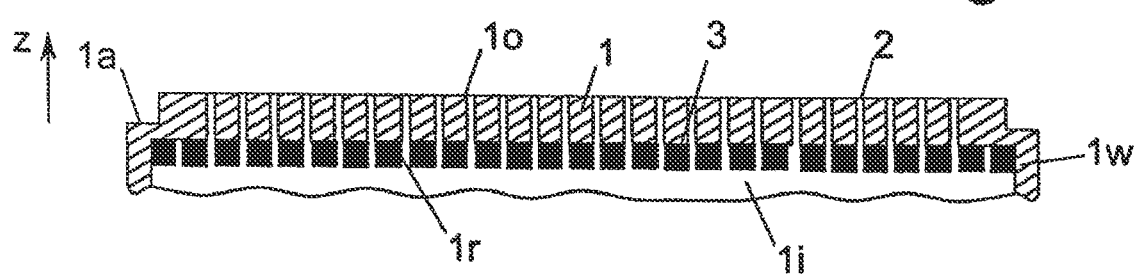
FIG. 1b shows a cross sectional view of the receiving means according to cutting line A-A from FIG. 1a, FIG. 2a shows a plan view of a receiving means as claimed in the invention in a second embodiment.
Figure 2A:
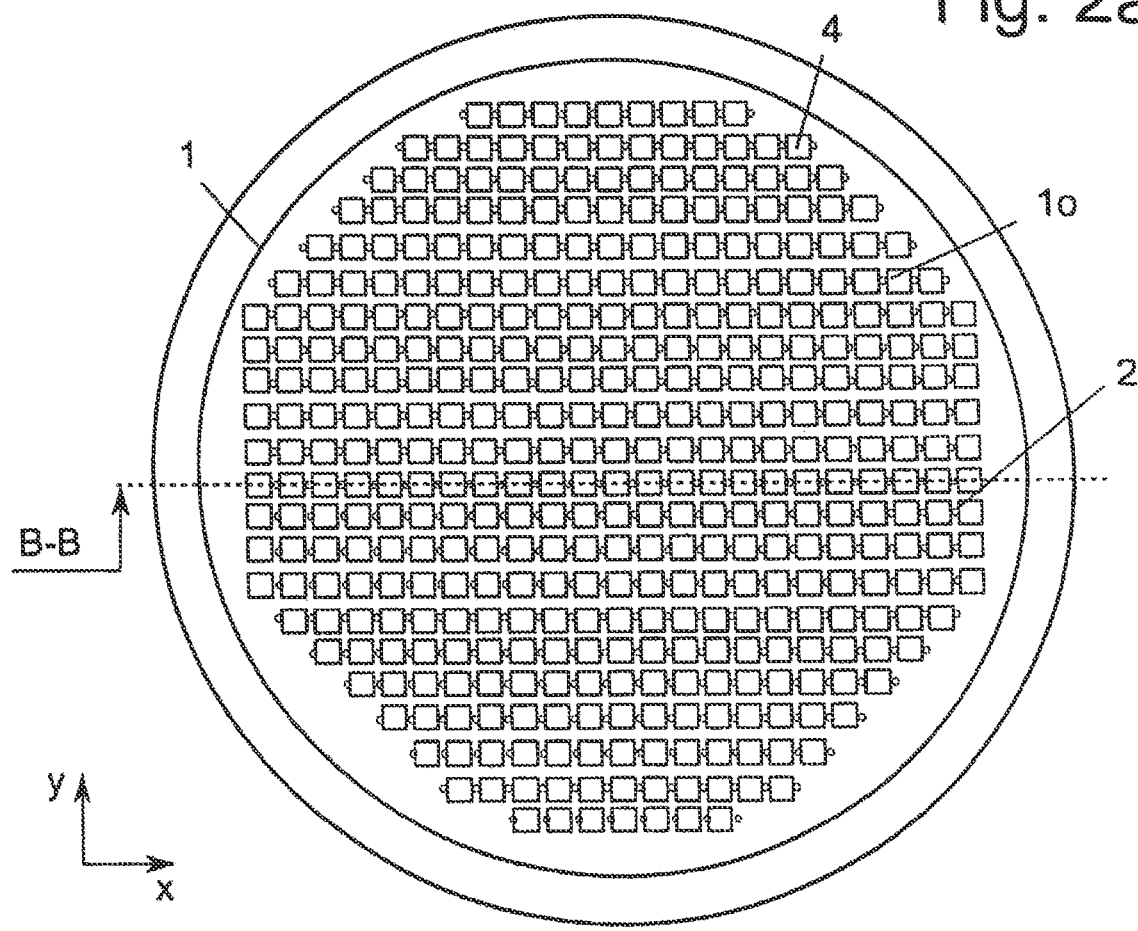
FIG. 2b shows a cross sectional view of the receiving means according to cutting line B-B from FIG. 2a, FIG. 3a shows a plan view of a receiving means as claimed in the invention in a third embodiment.
Figure 2B:
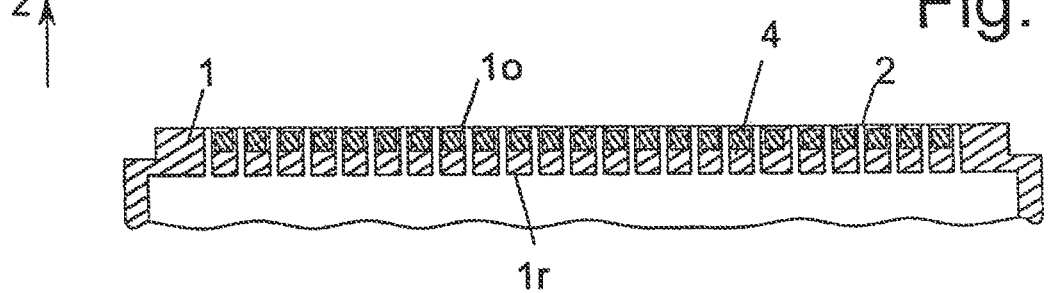

In the second embodiment shown in FIGS. 2a and 2b, heating elements 3 are not shown. I Instead of heating elements 3, or in combination with them, there are piezo-elements 4 on the mounting surface 1o, preferably with a greater distance to the back 1r than to the mounting surface 1o.

In this way, a controlled action on the mounting surface 1o is possible. The piezoelements 4 can cause strains in the nanometer to micron range upon activation.

The number of piezoelements 4 can correspond to the aforementioned number of heating elements 3, a combination of the two embodiments being conceivable as claimed in the invention.

In the third embodiment of the invention shown in FIGS. 3a and 3b, instead of or in combination with the heating elements 3 and/or the piezoelements 4, there are pins 5 which end on the mounting surface 1o with an especially pointed pin end 5e. In the initial position of the pins 5 the pin end 5e is flush with the mounting surface 1o. To the extent there is a local distortion of a wafer in the region of a certain pin 5 as information of the distortion map or strain map, the control means can act locally on the wafer by activating individual or several pins 5 by or near the pin 5 or the pin end 5e being moved in the Z direction in the direction of the wafer. The pin end 5e thus locally exposes the wafer to a compressive force which provides for a local bulging or deflection of the wafer at this point. The pin 5 can be guided to slide as a whole in a guide opening 7 which extends from the mounting surface 1o as far as the back 1r. Alternatively, only the pin end 5e can be moved in the pin 5 and the pin 5 or the lower section of the pin is fixed relative to the guide opening 7. In this way special sealing of the pin 5 or of the pins 5 can be ensured relative to the interior space 1r.

The number of pins 5 corresponds to the number of piezoelements 4 or heating elements 3, here a combination with one or more of the aforementioned embodiments being possible.

Figure 4A:
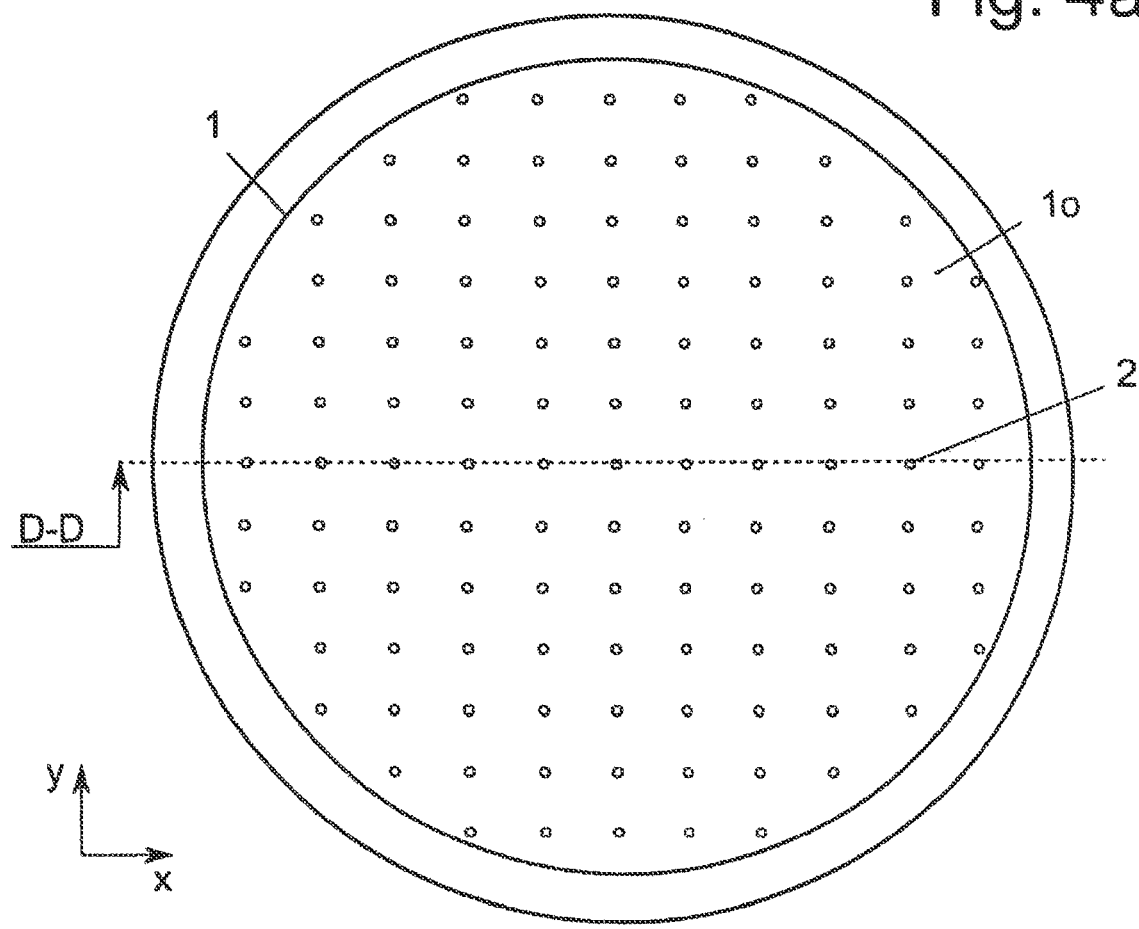
Figure 4B:
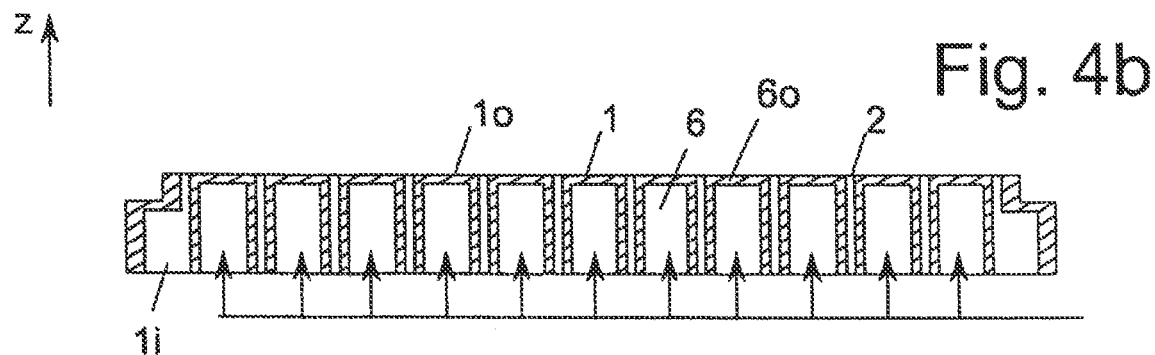

In the embodiment shown in FIG. 4, the receiver 1 has a plurality of pressure chambers 6, each having an upper wall 6o (shown in FIG. 4b) that together form the mounting surface 1o. The pressure chambers 6 extend through the interior space 1i and are sealed relative to this. Each of the pressure chambers 6 or groups of pressure chambers 6 can be separately pressurized, and control by the described control means can take place. The pressure chamber 6 is made, at least on its upper wall 6o, such that it yields when pressure is applied. Therefore the upper wall 60 is made either thinner and/or softer than the other boundary walls of the pressure chambers 6. The openings 2 are connected to the interior space 1i.

As claimed in the invention a simply minimum local deflection of the mounting surface 1o takes place by the aforementioned compensation means 3, 4, 5, 6 by a maximum 3 μm, especially a maximum 1 μm, preferably a maximum 100 nm.

In order to be able to counteract the local distortions with one or more of the aforementioned embodiments, as described above it is necessary that the control means knows where and to what extent or in what direction there are distortions in the wafer. Only then is controlled action or counteraction and compensation of distortions possible. The strain map of each wafer yields information in the form of strain vectors which are distributed over the wafer and which have been determined with a corresponding measurement means according to EP 10 015 569.6 (US 2012/0255365 A1). Corresponding control data can be filed in the control unit, especially empirically determined, in order to be able to undertake for each wafer an individual control according to the strain map of the wafer at the positions dictated by the position map of the wafer. Compensation can be carried out automatically in this way during alignment of the wafers.

The active control elements 3, 4, 5, 6 are shown not to scale in the figures and can also have different sizes and shapes.

Having described the invention, the following is claimed:

1. An apparatus for aligning a first wafer with a second wafer, having the following features:
    a device configured to detect local alignment errors that have occurred to strain and/or distortion of the first wafer relative to the second wafer using at least one of a first strain map and/or a first position map of the first wafer and a second strain map and/or a second position map of the second wafer;
    at least one receiving device configured to receive and hold at least one of the first wafer and the second wafer on a holding surface thereof via holding means, the at least one receiving device comprising temperature-controllable compensation means for at least partial active compensation of local and/or global distortions of the held at least one of the first wafer and the second wafer; and
    alignment means for aligning the first wafer with the second wafer, the alignment means being configured to supplement the at least partial compensation of the temperature-controllable compensation means based on the at least one of the first strain map and/or the first position map of the first wafer and the second strain map and/or the second position map of the second wafer,
    wherein the device configured to determine local alignment errors is further configured to verify whether the aligning is successful.

2. A method for aligning a first wafer with a second wafer, comprising:
    detecting, via a detecting device, local alignment errors that have occurred due to strain and/or distortion of the first wafer relative to the second wafer using at least one of a first strain map and/or a first position map of the first wafer and a second strain map and/or a second position map of the second wafer;
    receiving, on at least one receiving device, at least one of the first wafer and the second wafer;
    holding, on a holding surface of the at least one receiving device via holding means thereof, the at least one of the first wafer and the second wafer;
    at least partially compensating, via temperature-controllable compensation means of the at least one receiving device, local and/or global distortions of the held at least one of the first wafer and the second wafer;
    aligning, via alignment means, the first wafer with the second wafer, the aligning comprising supplementing the at least partial compensating based on the at least one of the first strain map and/or the first position map of the first wafer and the second strain map and/or the second position map of the second wafer; and
    verifying, via the detecting device, whether the aligning is successful.

* * * * *